(12) United States Patent
Vitanescu et al.

(10) Patent No.: US 12,184,103 B2
(45) Date of Patent: Dec. 31, 2024

(54) HYBRID VOLTAGE SUPPLY FOR A MEASURING INSTRUMENT

(71) Applicant: Endress+Hauser Flowtec AG, Reinach (CH)

(72) Inventors: Mihai Vitanescu, Rombach (CH); André Schaubhut, Schopfheim (DE); Frantz Bindler, Saint-Louis (FR)

(73) Assignee: Endress+Hauser Flowtec AG, Reinach (CH)

( * ) Notice: Subject to any disclaimer, the term of this patent is extended or adjusted under 35 U.S.C. 154(b) by 196 days.

(21) Appl. No.: 17/757,650

(22) PCT Filed: Dec. 1, 2020

(86) PCT No.: PCT/EP2020/084101
§ 371 (c)(1),
(2) Date: Jun. 17, 2022

(87) PCT Pub. No.: WO2021/121967
PCT Pub. Date: Jun. 24, 2021

(65) Prior Publication Data
US 2023/0020549 A1    Jan. 19, 2023

(30) Foreign Application Priority Data
Dec. 20, 2019   (DE) ..................... 10 2019 135 585.0

(51) Int. Cl.
*H02J 7/00* (2006.01)
*G01F 1/00* (2022.01)
(Continued)

(52) U.S. Cl.
CPC ............ *H02J 7/00308* (2020.01); *G01F 1/00* (2013.01); *G01R 19/10* (2013.01); *H02J 7/342* (2020.01)

(58) Field of Classification Search
None
See application file for complete search history.

(56) References Cited

U.S. PATENT DOCUMENTS 6,150,798 A * 11/2000 Ferry ..................... H02M 3/158
                                                                     323/288
7,372,234 B2 * 5/2008 Fujii ..................... H02J 7/0031
                                                                     320/112
(Continued)

FOREIGN PATENT DOCUMENTS

DE    102008029956 A1    12/2009
DE    102013104139 A1    10/2014
(Continued)

*Primary Examiner* — Peter J Macchiarolo
*Assistant Examiner* — Jermaine L Jenkins
(74) *Attorney, Agent, or Firm* — Mark A. Logan; Endress+Hauser (USA) Holding, Inc.

(57) ABSTRACT

The electronics comprises a load circuit, a power supply circuit having a rechargeable electrical energy storer, and a protection circuit. An input of the power supply circuit is adapted to be electrically connected with an external energy supply. Both the power supply circuit and the protection circuit have at least two operating modes. Additionally, the protection circuit is adapted in the first operating mode to monitor the cell voltage applied on the circuit input to determine whether its voltage level has exceeded a predetermined maximum value and, in given cases, automatically to deactivate the operating mode.

23 Claims, 4 Drawing Sheets

(51) Int. Cl.
*G01R 19/10* (2006.01)
*H02J 7/34* (2006.01)

(56) References Cited

U.S. PATENT DOCUMENTS

| | | | |
|---|---|---|---|
| 8,489,347 B2 * | 7/2013 | Shimizu | G01R 31/3842 |
| | | | 702/65 |
| 9,899,857 B2 * | 2/2018 | Fiedler | G05B 19/0426 |
| 11,411,433 B2 * | 8/2022 | Partovi | H02J 7/0013 |
| 2010/0026518 A1 | 2/2010 | Kirst et al. | |

FOREIGN PATENT DOCUMENTS

| | | |
|---|---|---|
| JP | 2015031582 A1 | 2/2015 |
| JP | 2015040799 A | 3/2015 |

\* cited by examiner

HYBRID VOLTAGE SUPPLY FOR A MEASURING INSTRUMENT

CROSS-REFERENCE TO RELATED APPLICATIONS

The present application is related to and claims the priority benefit of DPMA Patent Application No. 10 2019 135 585.0, filed on Dec. 20, 2019, and International Patent Application No. PCT/EP2020/084101, filed Dec. 1, 2020, the entire contents of which are incorporated herein by reference.

TECHNICAL FIELD

The invention relates to an electronics for a measuring device as well as to a measuring device having such an electronics.

BACKGROUND

Disclosed in US-A 2010/0026518 is an electronics for a measuring device and a measuring device having such an electronics and a measuring transducer. The electronics comprises an internal power supply circuit having a circuit input, a circuit output and a load circuit having a microprocessor and a circuit input. The circuit input of the load circuit is electrically connected with the circuit output of the power supply circuit, in such a manner that with an output voltage lying on the circuit output of the power supply circuit an electrical current flow from the first circuit output to the circuit input is enabled, along with a corresponding energy flow from the power supply circuit to the load circuit.

SUMMARY

The power supply circuit is adapted with the circuit input to be electrically connected to a circuit output of an external energy supply for providing a supply voltage for the electronics, in order to supply the load circuit with electrical energy from the network. Moreover, the power supply circuit also includes at least one rechargeable energy storer for electrical energy and the power supply circuit is additionally adapted to apply a cell voltage of the energy storer or a voltage proportional thereto to the circuit output and to supply the load circuit thereby with electrical energy, for example, when the circuit input is not connected to an external energy supply. The above-mentioned energy storer is formed by means of a capacitor, e.g. a double layer capacitor, or by means of a secondary-battery, e.g. a lithium-iron phosphate rechargeable battery (LiFe—PO4), a lithium-titanate rechargeable battery, a lithium-cobalt-nickel oxide rechargeable battery, a lithium manganese oxid rechargeable battery, an lithium polymer rechargeable battery (LiPoly), a sodium ion sulfur rechargeable battery or a nickel metal-hydride rechargeable battery.

In the case of an electronics having such a hybrid energy supply, namely an energy supply implemented in part by an internal battery supply and in part by an external network supply, particularly critical for operational safety of the electronics, and the measuring device formed therewith, are failure states, in the case of which the (network-) voltage applied to the circuit input of the power supply circuit undesirably reaches the internal energy storer, in such a manner that, as a result, an overvoltage, namely a charging voltage exceeding a maximum allowable voltage, is applied to the energy storer for a significant amount of time, namely sufficiently long for an overcharging, in given cases, even a destruction, of the energy storer. Such a failure state can arise, for example, when due to a failure of individual components of the electronics, possibly present other charged energy storers, such as e.g. capacitors, of the electronics and/or the external voltage are/is connected to the energy storer. A destruction of the internal energy storer can, furthermore, also lead to a total failure of the electronics and, consequently, to a total failure of the measuring device formed therewith.

Starting from the above described state of the art, an object of the invention is to protect a rechargeable energy storer provided in a network supplied electronics against an overvoltage, in given cases, even capable of destroying it.

For achieving the object, the invention resides in an electronics, for example, an electronics for a measuring device, which electronics comprises:
  a load circuit having a circuit input, for example, a load circuit having at least one microprocessor and/or at least one linear voltage regulator;
  a power supply circuit having a circuit input, a first circuit output, a second circuit output and at least one rechargeable, for example, chemical, or electrochemical, energy storer for electrical energy, for example, a super capacitor, for example, a power supply circuit formed by means of one or more direct voltage converters; as well as
  a protection circuit having a first circuit input, a second circuit input and a circuit output.

The rechargeable energy storer of the power supply circuit has a nominal capacity of, for example, greater than 500 As (ampere seconds), and provides, completely charged (charge status SoC=100%), a cell voltage of voltage level of nominal value equals, for example, greater than 3 V (volt).

In the electronics of the invention, the rechargeable energy storer is electrically connected with the second circuit output of the power supply circuit, in such a manner that the cell voltage of the rechargeable energy storer or a voltage proportional thereto is present on the second circuit output, and the circuit input of the load circuit is at least at times, for example, durably, electrically connected with the first circuit output of the power supply circuit, in such a manner that in the case of an output voltage on the first circuit output of the power supply circuit an electrical current flow is enabled, for example, with an electrical current level of greater than 100 mA (milliampere), from the first circuit output to the circuit input and/or an energy flow from the power supply circuit to the load circuit is enabled, for example, amounting to greater than 2000 Ws/h (watt-second per hour). Moreover, the circuit output of the protection circuit is electrically connected with the circuit input of the power supply circuit and the first circuit input of the protection circuit is, additionally, adapted to be electrically connected with a circuit output of an external energy supply providing a supply voltage for the electronics, for example, with a voltage level having a nominal value lying between 4 V and 60 V, and wherein the second circuit input of the protection circuit is electrically connected with the second circuit output of the power supply circuit, in such a manner that an input voltage applied to the second circuit input corresponds to the cell voltage provided by the rechargeable energy storer. In the case of the electronics of the invention, additionally, both the power supply circuit as well as also the protection circuit have, in each case, at least two operating modes. In a first operating mode of the power supply circuit, its rechargeable energy storer is switched to the first circuit output, in such a manner that the cell voltage provided by the energy storer or a voltage proportional thereto is applied to the first circuit output as a first output voltage, and in a second operating mode of the power supply circuit, its circuit input is switched to its first circuit output, for example, in such a manner that an input voltage applied to the circuit input is converted into a second output voltage applied to the first circuit output with a constant and/or predeterminable voltage level and/or that in the case of an input voltage applied to the circuit input an electrical current flow from the circuit input to the first circuit output is enabled. Furthermore, in a first operating mode of the protection circuit, its first circuit input is switched to its circuit output, for example, in such a manner that in the case of a voltage applied to the first circuit input an electrical current flow is enabled from the first circuit input to its circuit output, and an energy flow is enabled from the protection circuit to the power supply circuit, and in a second operating mode of the protection circuit its first circuit input and its circuit output are electrically isolated from one another, for example, in such a manner that even in the case of voltage applied to the first circuit input with a voltage level of greater than 4 V and less than 60 V only an electrical current flow with an electrical current level of at most 100 µA (microampere) is enabled from the first circuit input to the circuit output and/or only an energy flow of at most 20 Ws/h (watt-second per hour) is enabled from the protection circuit to the power supply circuit. Furthermore, the protection circuit of the electronics of the invention is adapted in the first operating mode to monitor the cell voltage applied to the second circuit input to determine whether its voltage level has exceeded a predetermined maximum value lying, for example, less than 0.2 V above its nominal value, and, in given cases, automatically to deactivate its first operating mode, for example, at the same time to activate its second operating mode, or automatically to switch from its first operating mode into its second operating mode.

Moreover, the invention resides also in a measuring system formed with such an electronics and comprising, additionally, electrically coupled with the electronics, a measuring transducer, which is adapted to register at least one, for example, physical or chemical, measured variable, and to transduce such into at least one measurement signal representing the measured variable.

In a first embodiment of the electronics of the invention, it is, furthermore, provided that in the second operating mode of the power supply circuit its rechargeable energy storer is not switched to the first circuit output, in such a manner that its rechargeable energy storer and its first circuit output are electrically isolated from one another, and the cell voltage provided by the rechargeable energy storer is not applied to the first circuit output.

In a second embodiment of the electronics of the invention, it is, furthermore, provided that in the first operating mode of the protection circuit its first circuit input is switched to its circuit output, in such a manner that in the case of a voltage applied to the first circuit input, for example, with a voltage level of greater than 4 V, an electrical current flow from the first circuit input to its circuit output is enabled, for example, with an electrical current level of greater than 100 mA, and/or an energy flow from the protection circuit to the power supply circuit is enabled, for example, an energy flow amounting to greater than 1000 Ws/h.

In a third embodiment of the electronics of the invention, it is, furthermore, provided that in the second operating mode of the protection circuit its first circuit input and its circuit output are electrically isolated from one another, in such a manner that even in the case of voltage applied to the first circuit input with a voltage level of greater than 4 V and/or less than 60 V and/or first circuit input electrically connected to a circuit output of an external energy supply delivering a supply voltage with a voltage level lying between 4 V and 60 V only an electrical current flow with an electrical current level of at most 100 µA (microampere) is enabled from the first circuit input to the circuit output and/or only an energy flow of at most 20 Ws/h (watt-second per hour) is enabled from the protection circuit to the power supply circuit.

In a fourth embodiment of the electronics of the invention, it is, furthermore, provided that the power supply circuit is adapted automatically to activate the first operating mode, for example, automatically to start it up, when the cell voltage of the rechargeable energy storer has a voltage level not subceeding a predetermined minimum value corresponding, for example, to greater than 105% of a discharge end voltage of the rechargeable energy storer, for example, in case no input voltage is applied to the circuit input, or an input voltage applied to the circuit input has a voltage level lying below a predetermined minimum value.

In a fifth embodiment of the electronics of the invention, it is, furthermore, provided that the power supply circuit is adapted automatically to activate the second operating mode, for example, automatically to start up or automatically to change from the first operating mode to the second operating mode, in case an input voltage applied to the circuit input has a voltage level not subceeding a predetermined minimum value, for example, lying above 4 V.

In a sixth embodiment of the electronics of the invention, it is, furthermore, provided that the power supply circuit is adapted automatically to deactivate the second operating mode, in case no input voltage is present on the circuit input, or an input voltage applied to the circuit input has a voltage level lying below a predetermined minimum value.

In a seventh embodiment of the electronics of the invention, it is, furthermore, provided that, in the case of power supply circuit operating in the first operating mode, a load current circuit of the electronics involving an electrical current path leading from the rechargeable energy storer of the power supply circuit is completed further through its circuit output and to the circuit input of the load circuit.

In an eighth embodiment of the electronics of the invention, it is, furthermore, provided that in the case of power supply circuit operating in the second operating mode and at the same time protection circuit operating in the first operating mode a load current circuit of the electronics involving an electrical current path leading from the first circuit input of the protection circuit is completed further through its circuit output and to the first circuit input of the power supply circuit and further through its circuit output and to the circuit input of the load circuit.

In a ninth embodiment of the electronics of the invention, it is, furthermore, provided that the protection circuit for monitoring the cell voltage includes a comparator, for example, a comparator formed by means of at least one difference amplifier, with a first voltage input, with a second voltage input and with a signal output, and the first circuit input of the protection circuit is formed by means of the first voltage input of the comparator and the second circuit input of the protection circuit is formed by means of the second voltage input of the comparator. Developing this embodiment of the electronics of the invention further, it is, additionally, provided that the protection circuit is adapted to activate its first operating mode or its second operating mode based on a signal level on the signal output of the comparator.

In a tenth embodiment of the electronics of the invention, it is, furthermore, provided that the power supply circuit includes a first direct voltage converter formed, for example, as a boost converter or as a buck converter, and an input of the first direct voltage converter is electrically connected with the at least one rechargeable energy storer and the first circuit output of the power supply circuit is formed by means of an output of the first direct voltage converter.

In an eleventh embodiment of the electronics of the invention, it is, furthermore, provided that the power supply circuit includes a second direct voltage converter, for example, one formed as a buck converter, and the circuit input of the power supply circuit is formed by means of an input of the second direct voltage converter and the first circuit output of the power supply circuit is formed by means of an output of the second direct voltage converter.

In a twelfth embodiment of the electronics of the invention, it is, furthermore, provided that the at least one rechargeable energy storer has first and second connection electrodes. Developing this embodiment of the electronics of the invention further, it is, additionally, provided that the power supply circuit includes first and second contact elements for the at least one rechargeable energy storer and the rechargeable energy storer is connected, for example, releasably, with the contact elements, in such a manner that the first connection electrode of the rechargeable energy storer electrically conductively contacts the first contact element and the second connection electrode of the rechargeable energy storer electrically conductively contacts the second contact element. Moreover, the power supply circuit can, furthermore, have at least one, for example, manually actuatable, switch, for example, a DIP-switch, or a DIL-switch, having first and second connection contacts and with a, for example, manually actuatable, switch operator, which switch can, in turn, be electrically connected with its first connection contact with the first contact element and adapted, by means of the switch operator, selectively to produce or break an electrically conductive connection between the first contact element and the second connection contact, for instance, in order to integrate the at least one rechargeable energy storer into the power supply circuit only when required, and/or during a start-up of the electronics.

In a thirteenth embodiment of the electronics of the invention, it is, furthermore, provided that the power supply circuit has at least one non-rechargeable energy storer, for example, electrically connected in parallel with the rechargeable energy storer, for example, a lithium thionylchloride battery, for storing electrical energy. Developing this embodiment of the electronics of the invention further, it is, additionally, provided that the at least one non-rechargeable energy storer has a nominal capacity of greater than 10 Ah (ampere hours), and/or that the at least one non-rechargeable energy storer provides a cell voltage with a voltage level having a nominal value of greater than 3 V and/or less than 4 V, for example, 3.6 V, and/or that the at least one non-rechargeable energy storer is embodied as a D-cell (IEC R20) and/or that the at least one non-rechargeable energy storer is adapted to charge the rechargeable energy storer.

In a fourteenth embodiment of the electronics of the invention, it is, furthermore, provided that the nominal value of the cell voltage (V_BAT) of the at least one rechargeable energy storer is less than 4 V.

In a fifteenth embodiment of the electronics of the invention, it is, furthermore, provided that the nominal capacity of the at least one rechargeable energy storer is greater than 400 As and/or less than 1000 As.

In a sixteenth embodiment of the electronics of the invention, it is, furthermore, provided that the at least one rechargeable energy storer is embodied as an AA-cell (IEC R6, AA cell).

In a seventeenth embodiment of the electronics of the invention, it is, furthermore, provided that the power supply circuit has a third operating mode, and the power supply circuit is adapted in the third operating mode to convert the cell voltage provided by the energy storer into a third output voltage applied to the first circuit output, for example, in such a manner that the voltage level of the third output voltage is higher than the voltage level of the cell voltage and/or that the voltage level of the output voltage lies below the nominal value of the cell voltage and/or that the voltage level of the output voltage is less than the voltage level of the second output voltage in the case of power supply circuit operating in the second operating mode. Developing this embodiment of the invention further, it is, additionally, provided that the power supply circuit is adapted automatically to activate the third operating mode, as soon as the cell voltage provided by the energy storer has a voltage level lying below a predetermined minimum value, for example, amounting to less than 3.3 V and/or greater than 80% of the nominal value.

In a first embodiment of the measuring system of the invention, it is, furthermore, provided that the electronics is adapted to receive and to evaluate the at least one measurement signal, for example, to ascertain based on the measurement signal measured values quantifying the at least one measured variable.

In a second embodiment of the measuring system of the invention, it is, furthermore, provided that the load circuit of the electronics includes an evaluator module, which is adapted, based on the at least one measurement signal, to ascertain measured values, for example, digital measured values, quantifying the measured variable. Developing this embodiment of the electronics of the invention further, it is, additionally, provided that the load circuit of the electronics includes, coupled with the evaluator module, a radio module, which is adapted by means of a radio signal to output measured values ascertained by the evaluator module.

A basic idea of the invention is to detect in a hybrid electronics, namely one fed in part by network and in part by battery, as early as possible and as safely as possible, a possible failure state within the electronics, especially within its power supply circuit, by monitoring the cell voltage of the rechargeable energy storer at least partially assuring battery feeding of the electronics. Thus, it has been found surprisingly that especially the cell voltage can be very sensitive to a number of typical, equally as well, critical, failure states within hybrid supplied electronics, in such a manner that a cell voltage with a voltage level deviating, especially upwards, only slightly from a nominal value can be a very precise indicator of such a failure state. Since small changes of the voltage level of the cell voltage can be registered and evaluated, possible failure states can be detected sufficiently early, in order to be able to introduce measures appropriate for preventing a damaging of the electronics, for example, measures such as separating the electronics from the external energy supply and/or isolating electrical current circuits within the electronics involving the energy storer. Another advantage of the invention is that a number of failure states occurring typically quite topologically distributed within the respective electronics can be very simply and safely monitored based on only one operating parameter.

The invention as well as advantageous embodiments thereof will now be explained in greater detail based on examples shown in the figures of the drawing. Equal, or equally acting or equally functioning, parts are provided in all figures with equal reference characters; when perspicuity requires or it otherwise appears sensible, reference characters already shown in earlier figures are omitted in subsequent figures. Other advantageous embodiments or additional developments, especially also combinations of, firstly, only individually explained aspects of the invention, result, furthermore, from the figures of the drawing and/or from claims per se.

DETAILED DESCRIPTION

Figure 1:
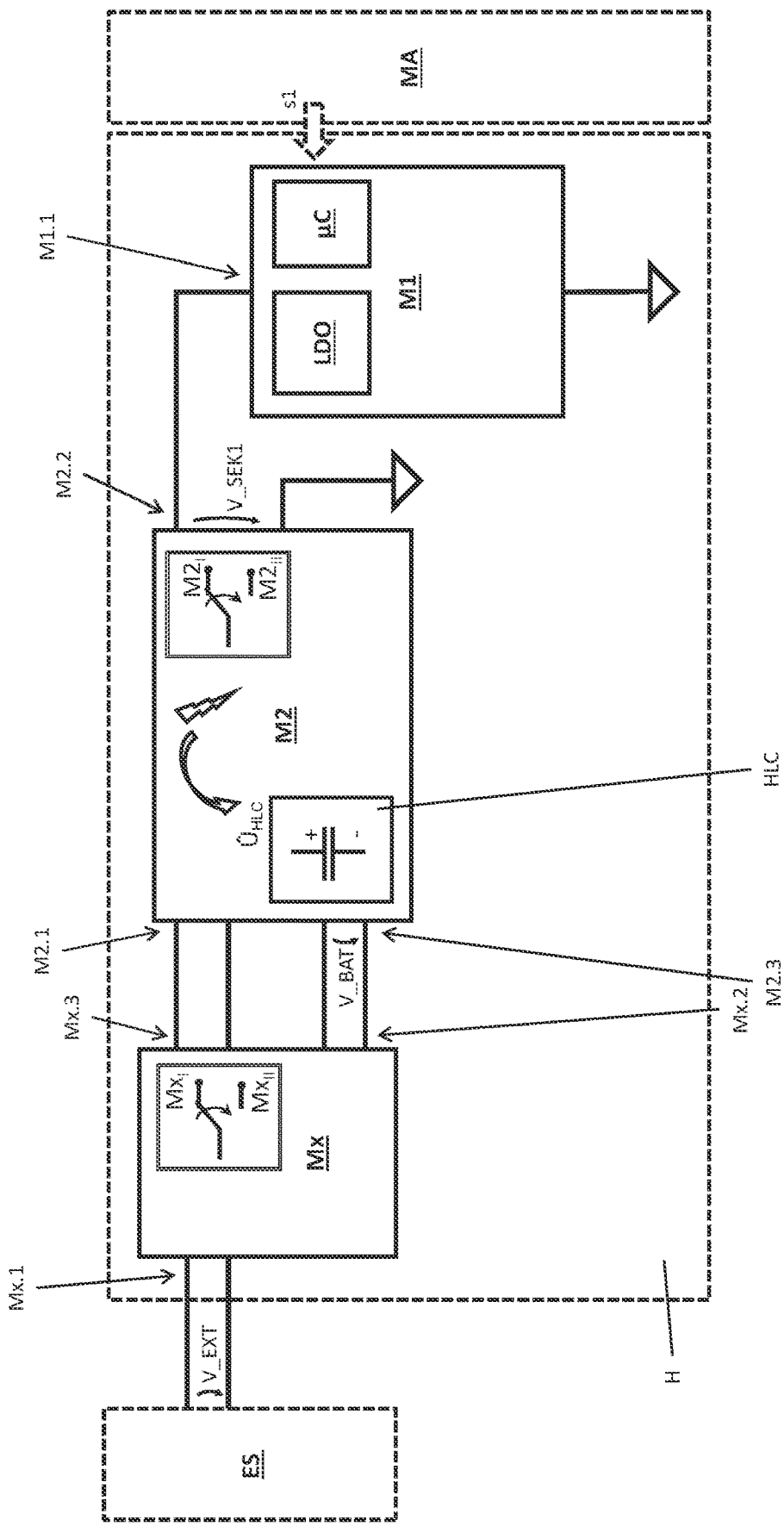
FIG. 1 shows schematically in the manner of a block diagram, an example of an embodiment of an electronics of the present disclosure.

Shown schematically in FIG. 1 is an example of an embodiment of an electronics of the invention. The electronics of the invention can be, for example, a component of a communication device having supplementally a signal receiver electrically connected with the electronics, in given cases, also a signal receiver remote from the electronics. The signal receiver can be, for example, a remote control (remote I/O), a programmable logic controller (PLC), a bus master in a fieldbus, for example, according to industrial standard IEC 61158:1999, especially according to one of the communication profile families, CPF1 (FOUNDATION FIELDBUS), CPF3 (PROFIBUS), CPF9 (HART) or CPF15 (MODBUS), wherein the signal receiver can be network and/or battery fed. Alternatively or supplementally, the electronics can, as well as also shown in FIG. 1, also be a component of a measuring system—, for example, a measuring and/or switch device of industrial measuring and automation technology with a measuring transducer MT electrically coupled with the electronics, for instance a flow-measuring transducer, which, in turn, is adapted to register at least one physical or chemical, measured variable, for example, a flow- and/or a substance parameter, of a measured substance flowing in a pipeline, and to deliver at least one measurement signal s1 representing the measured variable, especially for processing in the electronics. The electronics can, thus, be adapted to receive the measurement signal s1 and correspondingly to process it, for example, in order to ascertain measured values, in given cases, digital measured values, quantifying the at least one measured variable. Moreover, the electronics can, as well as also shown in FIG. 1, be arranged within a protective housing H, which, additionally, can be placed, for example, directly on the above mentioned measuring transducer MT, in order to form a measuring device of compact construction. Accordingly, the load circuit includes in an additional embodiment, for example, formed by means of a microcontroller (μC), an evaluator module, which is adapted, based on the above described at least one measurement signal s1 to ascertain measured values, for example, digital measured values, quantifying the at least one measured variable. For transmitting measured values ascertained by means of the electronics to the above described signal receiver, the load circuit of the electronics can have, coupled with the evaluator module, for example, also a radio module, which is adapted to output by means of a radio signal measured values ascertained by the evaluator module. Alternatively or supplementally, the above-mentioned evaluator module can also be adapted to output the measured values by wire, for example, to transmit such to the above described signal receiver by means of an analog, electrical current signal or a digital signal conforming, in given cases, to one of the above described fieldbusses.

The electronics of the invention includes a load circuit M1 with a circuit input, a power supply circuit M2 with a circuit input, a first circuit output, a second circuit output and at least one, especially chemical, or electrochemical, rechargeable, electrical energy storer HLC, for example, a super capacitor. The load circuit M1 can, as well as also shown in FIG. 1, be formed, for example, by means of at least one microcontroller μC and/or at least one linear voltage regulator LDO.

The energy storer HLC of the power supply circuit M2 has a nominal capacity amounting, for example, to 400 As (ampere seconds), and is adapted, completely charged, consequently in the case of a charge status (SoC—state of charge) of 100%, to provide a cell voltage V_BAT with a voltage level having a nominal value of, for example, 3.6 V (volt). The energy storer HLC is electrically connected with the second circuit output of the power supply circuit M2, in such a manner that the cell voltage V_BAT of the energy storer HLC, or a voltage proportional thereto, lies on the second circuit output.

For incorporating the energy storer HLC into the power supply circuit M2, especially for electrical connecting of the energy storer HLC to the second circuit output of the power supply circuit M2, the energy storer HLC can, furthermore, have first and second connection electrodes and the power supply circuit M2 can have corresponding first and second contact elements for the at least one energy storer HLC, namely contact elements electrically connected to the second circuit output, or even at least partially forming it. In an embodiment of the invention, it is, furthermore, provided that the energy storer HLC is, for example, connected, even releasably, to the above described contact elements, in such a manner that the first connection electrode of the energy storer HLC electrically conductively contacts the first contact element and the second connection electrode of the energy storer HLC electrically conductively contacts the second contact element. In an additional embodiment of the invention, the power supply circuit M2 includes, additionally, at least one, especially manually actuatable, switch DIL. The switch DIL, embodied, for example, as a DIP-, or DIL, switch, includes first and second connection contacts as well as a, in given cases, manually actuatable, switch operator and is electrically connected with its first connection contact with the first contact element of the energy storer HLC. Additionally, the switch DIL is adapted by means of its switch operator selectively to produce or to break an electrically conductively connection between the first contact element and the second connection contact, for example, in order to integrate the energy storer HLC into the power supply circuit only when required and/or during a start-up of the electronics. The connection electrodes of the energy storer HLC and the contact elements of the power supply circuit M2 can, furthermore, for example, also be adapted to produce a secure, equally as well, releasable, mechanical connection between energy storer HLC and power supply circuit M2.

In the case of the electronics of the invention, it is, furthermore, provided that the circuit input of the load circuit M1 is at least at times, in given cases, also durably, electrically connected with the first circuit output of the power supply circuit M2, in such a manner that in the case of output voltage (V_SEK1; V_SEK2) present on the first circuit output of the power supply circuit M2 an electrical current flow from the first circuit output to the circuit input and/or an energy flow from the power supply circuit M2 to the load circuit M1 is enabled; this, especially, in such a manner that the above-mentioned electrical current flow in the case of an output voltage lying in the range between 2 V and 4 V has an electrical current level of greater than 100 mA (milliampere) and/or the above-mentioned energy flow amounts to greater than 2000 Ws/h (watt-second per hour).

For detecting a possible failure state within the electronics, particularly also within the power supply circuit M2, the electronics of the invention comprises, furthermore, a protection circuit Mx. The protection circuit Mx includes a first circuit input, a second circuit input as well as a circuit output. The circuit output of the protection circuit Mx is electrically connected with the circuit input of the power supply circuit M2. Additionally, the first circuit input of the protection circuit Mx is adapted to be electrically connected to a circuit output of an external energy supply ES providing a supply voltage V_EXT, for example, a DC supply voltage, for the electronics, and the second circuit input of the protection circuit Mx is electrically connected with the second circuit output of the power supply circuit M2, in such a manner that an input voltage applied to the second circuit input corresponds to the cell voltage V_BAT provided by the energy storer HLC. The power supply circuit M2, consequently the electronics formed therewith, is adapted in an additional embodiment to be operated with a supply voltage V_EXT, especially a supplied DC voltage, having a nominal value (nominal voltage) lying between 4 V and 60 V.

In the case of the electronics of the invention, additionally, both the power supply circuit as well as also the protection circuit have, in each case, at least two operating modes ($M2_I$, $M2_{II}$; $Mx_I$, $Mx_{II}$), namely a first operating mode, $M2_I$ and $Mx_I$, respectively, and at least a second operating mode, $M2_{II}$ and $Mx_{II}$, respectively.

In the first operating mode $M2_I$ of the power supply circuit, its energy storer HLC is switched to the first circuit output, in such a manner that the cell voltage provided by the energy storer or a voltage proportional thereto lies on the first circuit output as a first output voltage V_SEK1 (V_BAT=V_SEK1) and, in the second operating mode $M2_{II}$ of the power supply circuit M2, its circuit input is switched to its first circuit output; this, especially, in such a manner that an input voltage V_EXT applied to the circuit input, for example, a direct voltage, is converted into a second output voltage V_SEK2 of constant and/or predeterminable voltage level present on the first circuit output, and that in the case of an input voltage V_EXT applied to the circuit input an electrical current flow from the circuit input to the first circuit output is enabled and/or in such a manner that, as a result, a first load current circuit of the electronics is completed, which involves an electrical current path leading from the energy storer HLC, through the circuit output of the power supply circuit M2 and to the circuit input of the load circuit M1. In an additional embodiment of the invention, it is, additionally, provided that in the second operating mode $M2_{II}$ of the power supply circuit M2 its energy storer HLC is not switched to the first circuit output, in such a manner that the energy storer HLC and the first circuit output are electrically isolated from one another, and that the cell voltage provided by the energy storer is not present on the first circuit output.

In the case of the electronics of the invention, it is, furthermore, provided that in the first operating mode Mx, of the protection circuit Mx its first circuit input is switched to its circuit output; this, especially, in such a manner that in the case of a voltage applied to the first circuit input an electrical current flow is enabled from the first circuit input to its circuit output, and an energy flow is enabled from the protection circuit to the power supply circuit; this, especially, also in such a manner that in the first operating mode of operating protection circuit and at the same time in the second operating mode of operating power supply circuit M2 a second load current circuit of the electronics is completed, which involves an electrical current path leading from the first circuit input of the protection circuit Mx, further through its circuit output and to the first circuit input of the power supply circuit M2 and further through its circuit output and to the circuit input of the load circuit M1.

In the second operating mode $Mx_{II}$ of the protection circuit Mx, in turn, its first circuit input and its circuit output are electrically isolated from one another; this, especially, in such a manner that even in the case of voltage applied to the first circuit input with a voltage level of greater than 4 V and less than 60 V an electrical current flow with an electrical current level of only at most 100 µA (microampere) is enabled from the first circuit input to the circuit output and/or only an energy flow of at most 20 Ws/h (watt-second per hour) is enabled from the protection circuit to the power supply circuit. Moreover, the protection circuit Mx of the electronics of the invention is adapted in the first operating mode to monitor the cell voltage applied to the second circuit input as to whether its voltage level has exceeded a predetermined, maximum value $Û_{HLC}$, for example, lying less than 0.2 V above its nominal value. Additionally, protection circuit Mx is adapted automatically to deactivate its first operating mode, for example, at the same time to activate its second operating mode, or automatically to switch from its first operating mode into its second operating mode, in case it is detected in the case of the above described monitoring of the cell voltage of the energy storer HLC that the cell voltage has exceeded the above described maximum value $Û_{HLC}$. For monitoring the cell voltage, the protection circuit Mx includes in an additional embodiment of the invention, furthermore, a comparator, for example, formed by means of at least one difference amplifier, and having a first voltage input, a second voltage input and a signal output (nominally having only two states). For this case, the first circuit input of the protection circuit can be formed by means of the first voltage input of the comparator, in given cases, also with interposed voltage regulator and/or one or more Zener-diodes providing a reference voltage derived from the supply voltage V_EXT and/or further stabilized, and the second circuit input of the protection circuit can be formed by means of the second voltage input of the comparator, in given cases, also with an interposed voltage divider for the cell voltage V_BAT. Moreover, the protection circuit Mx can be adapted, based on a signal level on the signal output of the comparator, to activate its first operating mode or its second operating mode; this, especially, in such a manner that immediately after a change of a signal level on the signal output signaling an exceeding the maximum value $Û_{HLC}$ by the cell voltage the second operating mode of the protection circuit is activated.

In an additional embodiment of the invention, it is provided that in the first operating mode of the protection circuit Mx in the case of a voltage applied to the first circuit input with a voltage level of greater than 4 V an electrical current flow is enabled from the first circuit input to its circuit output with an electrical current level of greater than 100 mA, or an energy flow is enabled amounting to greater than 1000 Ws/h from the protection circuit Mx to the power supply circuit M2, and/or it is provided that in the second operating mode of the protection circuit an electrical current flow with an electrical current level of only at most 100 μA (microampere) is enabled from the first circuit input to the circuit output and/or an energy flow of only at most 20 Ws/h (watt-second per hour) is enabled from the protection circuit to the power supply circuit; this particularly also for the case, in which a voltage with a voltage level of greater than 4 V and/or less than 60 V is present on the first circuit input and/or that the first circuit input of the protection circuit Mx is electrically connected to a circuit output of an external energy supply (ES) delivering a supply voltage having a voltage level lying between 4 V and 60 V.

In an additional embodiment of the invention, the power supply circuit M2 is, furthermore, also adapted to activate the first operating mode automatically, for example, even after a connecting of the energy storer HLC, or even after actuation of the above described switch DIL; this, especially, when the cell voltage of the energy storer HLC has a voltage level not subceeding a predetermined minimum value, for example, corresponding to greater than 105% of a discharge end voltage of the energy storer HLC, and/or in case there is no longer an input voltage on the circuit input, or an input voltage applied to the circuit input has a voltage level lying below a predetermined minimum value. Alternatively, or in supplementation, the power supply circuit M2 can, additionally, be adapted to activate the second operating mode automatically, for example, automatically to start up or automatically to change from the first operating mode to the second operating mode, in case an input voltage applied to the circuit input has a voltage level not subceeding a predetermined minimum value, for example, a minimum value lying above 4 V, and/or the power supply circuit can be adapted to deactivate the second operating mode automatically, in case there is no input voltage on the circuit input, or an input voltage applied to the circuit input has a voltage level lying below a predetermined minimum value. A detecting of the input voltage, or its correct voltage level and/or the above described (minimum-)voltage level of the cell voltage can, in turn, occur by means of one or more comparators, for example, in each case, formed by means of one or more difference amplifiers and correspondingly provided in the power supply circuit.

In an additional embodiment of the invention, it is, furthermore, provided that the power supply circuit M2 includes, besides the two previously indicated operating modes M2, and $M2_{II}$, an additional, third operating mode $M2_{III}$, in such a manner that the power supply circuit M2 is adapted in the third operating mode $M2_{III}$ to convert the cell voltage V_BAT provided by the energy storer HLC into a third output voltage V_SEK3 applied to the first circuit output of the power supply circuit M2; this, especially, also in such a manner that the voltage level of the output voltage V_SEK3 is higher than the voltage level of the cell voltage V_BAT of the energy storer HLC, or lies below the nominal value of the cell voltage V_BAT. Alternatively or supplementally, the voltage level of the output voltage V_SEK3 provided in the third operating mode by the power supply circuit can also differ from the particular voltage level of the output voltage V_SEK1, respectively V_SEK2, provided in each case in the first operating mode and/or in the second operating mode, especially in such a manner that the voltage level of the output voltage V_SEK3 is less than the voltage level of the output voltage V_SEK2 in the case of power supply circuit operating in the second operating mode. Moreover, the power supply circuit can, furthermore, be adapted to activate the third operating mode automatically, as soon as the cell voltage V_BAT provided by the energy storer HLC has a voltage level lying below a predetermined minimum value. The minimum value can be, for example, less than 3.3 V and/or greater than 80% of the nominal value.

Figure 2:
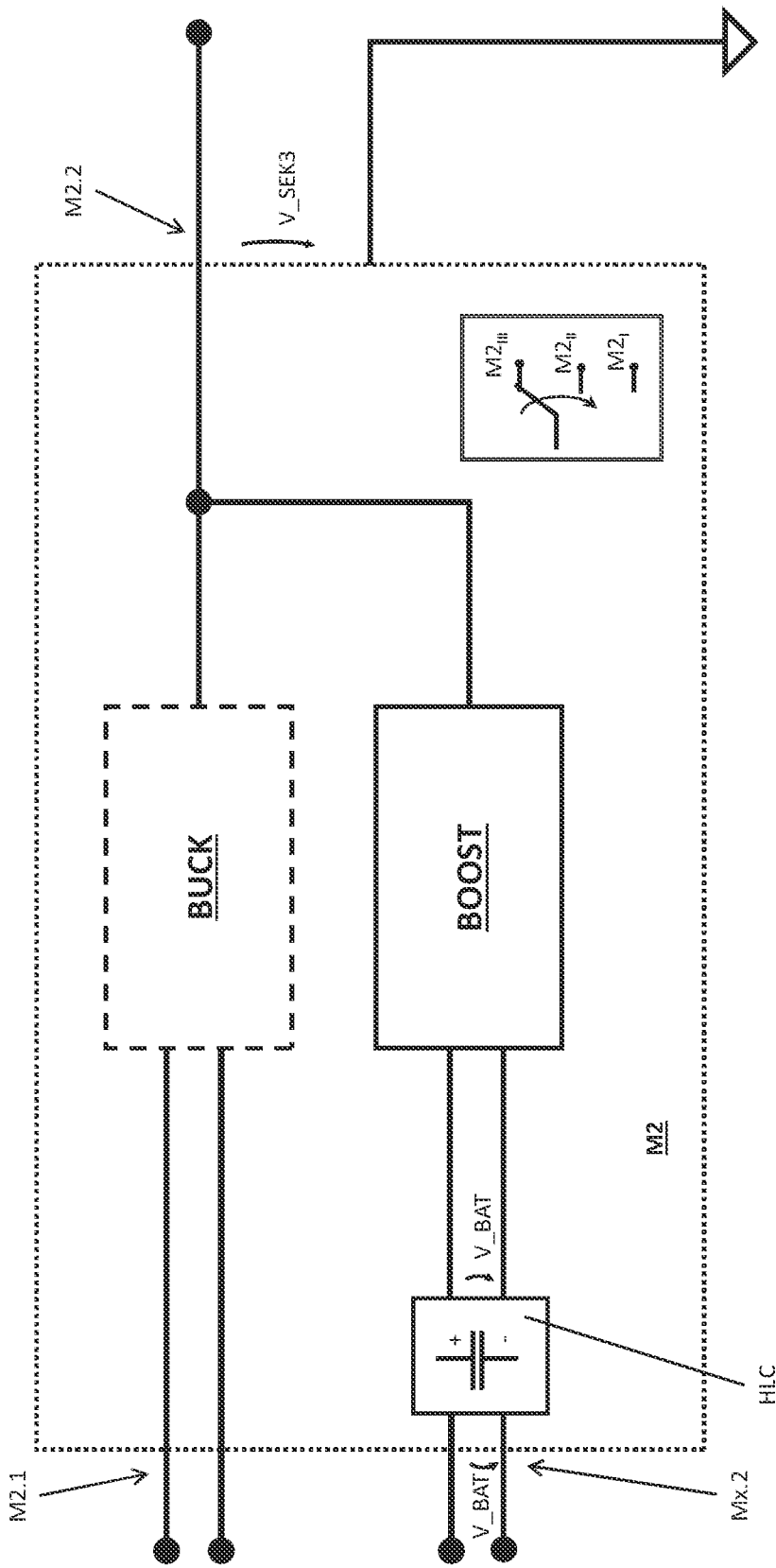
FIGS. 2 and 3 shows schematically in the manner of a block diagram, embodiments of a power supply circuit of an electronics of FIG. 1.

For converting the cell voltage V_BAT provided by the energy storer HLC into a direct voltage derived therefrom, equally as well, stabilized and/or having a constant voltage level, for example, serving also as output voltage V_SEK3, the power supply circuit includes in an additional embodiment a (first) direct voltage converter BOOST, in such a manner that, such as shown schematically in FIG. 2, an input of the direct voltage converter BOOST is connected with the at least one energy storer HLC and the first circuit output of the power supply circuit M2 is formed by means of an output of the direct voltage converter BOOST, especially, however, the second circuit output of the power supply circuit M2 is not formed by means of the output of the direct voltage converter BOOST. The direct voltage converter BOOST can advantageously be embodied, for example, as a boost converter or as an inverting buck-boost converter.

Figure 3:
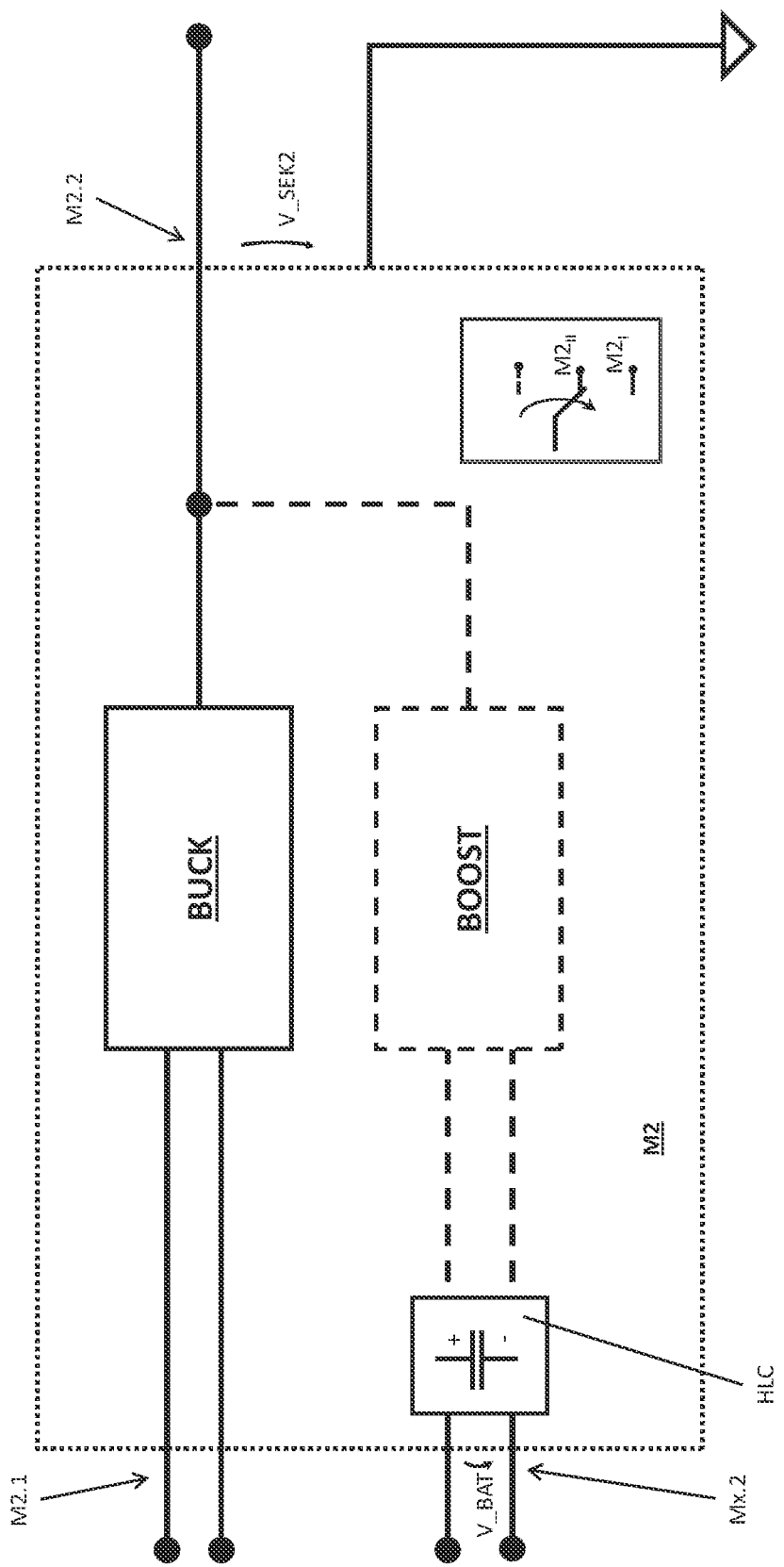

Particularly for the above described case, in which the voltage V_EXT on the circuit input of the power supply circuit M2 in its second operating mode is a direct voltage, the power supply circuit M2 can, furthermore, as well as also shown schematically in FIG. 3, have a second direct voltage converter BUCK formed, for example, as a buck converter and serving for converting the input voltage V_EXT into the output voltage V_SEK2 output on the first circuit output of the power supply circuit M2, in such a manner that the circuit input of the power supply circuit M2 is formed by means of an input of the direct voltage converter BUCK and the first circuit output of the power supply circuit M2 is formed by means of an output of the direct voltage converter BUCK. For the above described case, in which the power supply circuit M2 also includes the direct voltage converter BOOST, its output and the output of the direct voltage converter BUCK can, as well as also shown in FIGS. 2 and 3, be electrically connected with one another.

Figure 4:
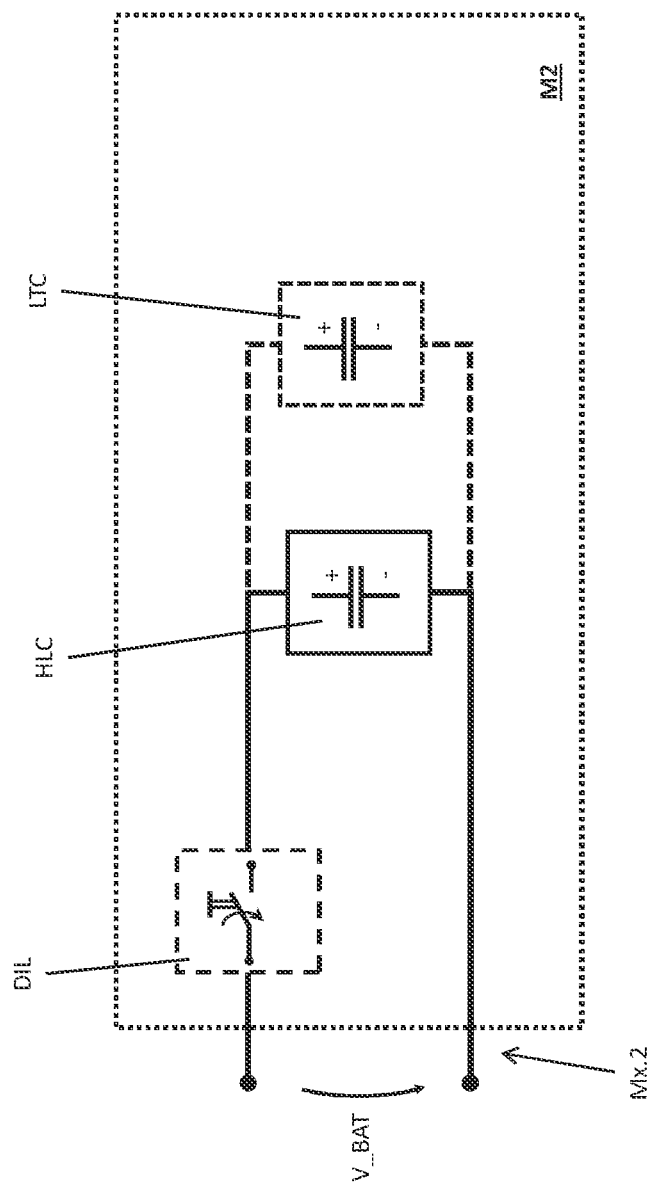
FIG. 4 shows schematically in the manner of a block diagram, another embodiment of a power supply circuit of an electronics of FIG. 1.

In an additional embodiment of the invention, the energy storer HLC has a nominal capacity of greater than 400 As (ampere seconds), especially greater than 500 As, and the energy storer HLC provides, completely charged, consequently in the case of a charge status (SoC—state of charge) of 100%, a cell voltage V_BAT having a voltage level with a nominal value of greater than 2.4 V (volt). Particularly for the above described case, in which the electronics is connected to an external energy supply (ES), the nominal capacity of the at least one rechargeable energy storer HLC can, in given cases, also amount to less than 1000 As. Alternatively or supplementally, the nominal value of the cell voltage V_BAT of the energy storer HLC can amount to, for example, also less than 4 V. For increasing the electrical energy provided with the power supply circuit M2 by battery, consequently in the first operating mode $M2_I$, or the electrical power thereby available within the electronics, the power supply circuit M2 can, such as shown schematically in FIG. 4, additionally, have at least one non-rechargeable electrical energy storer LTC, for example, one connected electrically in parallel with the rechargeable energy storer HLC, for example, a lithium thionyl-chloride battery. In an additional embodiment of the invention, it is, furthermore, provided that the energy storer LTC has a nominal capacity of greater than 10 Ah (ampere hours) and/or a cell voltage with a voltage level having a nominal value of greater than 2.4 V and/or less than 3.9 V. The energy storer LTC can, for example, be embodied as a D-cell (IEC R20) and/or even be adapted, when required, to charge the rechargeable energy storer LTC.

The invention claimed is:

1. An electronics for a measuring device, comprising:
a load circuit having a circuit input, at least one microprocessor, and at least one linear voltage regulator;
a power supply circuit formed by one or more direct voltage converters, the power supply circuit including a circuit input, a first circuit output, a second circuit output, and a rechargeable electrical energy storer having a nominal capacity and completely charged providing a cell voltage of voltage level of nominal value, wherein the energy storer is electrically connected with the second circuit output of the power supply circuit in such a manner that the cell voltage of the energy storer or a voltage proportional thereto lies on the second circuit output; and
a protection circuit including a first circuit input, a second circuit input, and a circuit output,
wherein the circuit input of the load circuit is at least at times electrically connected with the first circuit output of the power supply circuit in such a manner that in the case of an output voltage on the first circuit output of the power supply circuit an electrical current flow is enabled, from the first circuit output to the circuit input and/or an energy flow from the power supply circuit to the load circuit is enabled
wherein the circuit output of the protection circuit is electrically connected with the circuit input of the power supply circuit,
wherein the first circuit input of the protection circuit is adapted to be electrically connected with a circuit output of an external energy supply providing a supply voltage for the electronics, and wherein the second circuit input of the protection circuit is electrically connected with the second circuit output of the power supply circuit, in such a manner that an input voltage applied to the second circuit input corresponds to the cell voltage provided by the energy storer,
wherein both the power supply circuit as well as also the protection circuit have, in each case, at least two operating modes,
wherein in a first operating mode of the power supply circuit its energy storer is switched to the first circuit output in such a manner that the cell voltage provided by the energy storer or a voltage proportional thereto is applied to the first circuit output as a first output voltage,
wherein in a second operating mode of the power supply circuit, its circuit input is switched to its first circuit output,
wherein in a first operating mode of the protection circuit, its first circuit input is switched to its circuit output,
wherein in a second operating mode of the protection circuit its first circuit input and its circuit output are electrically isolated from one another, and
wherein the protection circuit is adapted in the first operating mode to monitor the cell voltage applied to the second circuit input to determine whether its voltage level has exceeded a predetermined maximum value and, in given cases, automatically to deactivate its first operating mode, or automatically to switch from its first operating mode into its second operating mode.

2. The electronics as claimed in claim 1,
wherein in the second operating mode of the power supply circuit its energy storer is not switched to the first circuit output, in such a manner that its energy storer and its first circuit output are electrically isolated from one another, and the cell voltage provided by the energy storer is not applied to the first circuit output; and/or
wherein in the first operating mode of the protection circuit its first circuit input is switched to its circuit output, in such a manner that in the case of a voltage applied to the first circuit input, an electrical current flow from the first circuit input to its circuit output is enabled, and/or an energy flow from the protection circuit to the power supply circuit is enabled; and/or
wherein in the second operating mode of the protection circuit its first circuit input and its circuit output are electrically isolated from one another, in such a manner that even in the case of voltage applied to the first circuit input with a voltage level of greater than 4 V and/or less than 60 V and/or first circuit input electrically connected to a circuit output of an external energy supply delivering a supply voltage with a voltage level lying between 4 V and 60 V only an electrical current flow with an electrical current level of at most 100 µA (microampere) is enabled from the first circuit input to the circuit output and/or only an energy flow of at most 20 Ws/h (watt-second per hour) is enabled from the protection circuit to the power supply circuit.

3. The electronics as claimed in claim 2, wherein the power supply circuit is adapted automatically to activate the first operating mode, when the cell voltage of the energy storer has a voltage level not subceeding a predetermined minimum value; and/or
wherein the power supply circuit is adapted automatically to activate the second operating mode, in case an input voltage applied to the circuit input has a voltage level not subceeding a predetermined minimum value; and/or
wherein the power supply circuit is adapted automatically to deactivate the second operating mode, in case no input voltage is present on the circuit input, or an input voltage applied to the circuit input has a voltage level lying below a predetermined minimum value.

4. The electronics as claimed in claim 1, wherein, in the case of power supply circuit operating in the first operating mode, a load current circuit of the electronics involving an electrical current path leading from the energy storer of the power supply circuit is completed further through its circuit output and to the circuit input of the load circuit.

5. The electronics as claimed in claim 1, wherein in the case of power supply circuit operating in the second operating mode and at the same time protection circuit operating in the first operating mode a load current circuit of the electronics involving an electrical current path leading from the first circuit input of the protection circuit is completed further through its circuit output and to the first circuit input of the power supply circuit and further through its circuit output and to the circuit input of the load circuit.

6. The electronics as claimed in claim 1,
wherein the protection circuit for monitoring the cell voltage includes a comparator formed by means of at least one difference amplifier having, a first voltage input, a second voltage input, and a signal output, and
wherein the first circuit input of the protection circuit is formed by means of the first voltage input of the comparator and the second circuit input of the protection circuit is formed by means of the second voltage input of the comparator.

7. The electronics as claimed in claim 6, wherein the protection circuit is adapted to activate its first operating mode or its second operating mode based on a signal level on the signal output of the comparator.

8. The electronics as claimed in claim 1,
wherein the power supply circuit includes a first direct voltage converter formed as a boost converter or as a buck converter, and
wherein an input of the first direct voltage converter is electrically connected with the at least one energy storer and the first circuit output of the power supply circuit is formed by an output of the first direct voltage converter.

9. The electronics as claimed in claim 8,
wherein the power supply circuit includes a second direct voltage converter formed as a buck converter, and
wherein the circuit input of the power supply circuit is formed by an input of the second direct voltage converter and the first circuit output of the power supply circuit is formed by means of an output of the second direct voltage converter.

10. The electronics as claimed in claim 9, wherein the output of the first direct voltage converter and the output of the second direct voltage converter are electrically connected with one another.

11. The electronics as claimed in claim 1, wherein the at least one rechargeable energy storer has first and second connection electrodes.

12. The electronics as claimed in claim 11,
wherein the power supply circuit includes first and second contact elements for the at least one energy storer, and
wherein the energy storer is connected, with the contact elements in such a manner that the first connection electrode of the energy storer electrically conductively contacts the first contact element and the second connection electrode of the energy storer electrically conductively contacts the second contact element.

13. The electronics as claimed in claim 12,
wherein the power supply circuit has at least one switch having first and second connection contacts and with a manually actuatable switch operator, and
wherein the switch is electrically connected with its first connection contact with the first contact element and adapted, by means of the switch operator selectively to produce or to break an electrically conductively connection between the first contact element and the second connection contact.

14. The electronics as claimed in claim 13, wherein the switch is adapted to integrate the at least one rechargeable energy storer into the power supply circuit.

15. The electronics as claimed in claim 1, wherein the power supply circuit has at least one non-rechargeable energy storer electrically connected in parallel with the rechargeable energy storer for storing electrical energy.

16. The electronics as claimed in claim 15,
wherein the at least one non-rechargeable energy storer has a nominal capacity of greater than 10 Ah (ampere hours); and/or
wherein the at least one non-rechargeable energy storer provides a cell voltage with a voltage level having a nominal value of greater than 3 V and/or less than 4 V, and/or
wherein the at least one non-rechargeable energy storer is embodied as a D cell (IEC R20); and/or
wherein the at least one non-rechargeable energy storer is adapted to charge the rechargeable energy storer.

17. The electronics as claimed in claim 1,
wherein the nominal value of the cell voltage of the at least one rechargeable energy storer is less than 4 V; and/or
wherein the nominal capacity of the at least one rechargeable energy storer is greater than 400 As and/or less than 1000 As; and/or
wherein the at least one rechargeable energy storer is embodied as an AA cell (IEC R6, AA cell).

18. The electronics as claimed in claim 1,
wherein the power supply circuit has a third operating mode, and
wherein the power supply circuit is adapted in the third operating mode to convert the cell voltage provided by the rechargeable energy storer into a third output voltage applied on the first circuit output.

19. The electronics as claimed in claim 18, wherein the power supply circuit is adapted automatically to activate the third operating mode as soon as the cell voltage provided by the rechargeable energy storer has a voltage level lying below a predetermined minimum value.

20. A measuring system, comprising:
an electronics, comprising:
a load circuit having a circuit input, at least one microprocessor, and at least one linear voltage regulator;
a power supply circuit formed by one or more direct voltage converters, the power supply circuit including a circuit input, a first circuit output, a second circuit output, and a rechargeable electrical energy storer having a nominal capacity and completely charged providing a cell voltage of voltage level of nominal value equals or greater than 3 V (volt), wherein the energy storer is electrically connected with the second circuit output of the power supply circuit in such a manner that the cell voltage of the energy storer or a voltage proportional thereto lies on the second circuit output; and
a protection circuit including a first circuit input, a second circuit input, and a circuit output,
wherein the circuit input of the load circuit is at least at times electrically connected with the first circuit output of the power supply circuit in such a manner that in the case of an output voltage on the first circuit output of the power supply circuit an electrical current flow is enabled, from the first circuit output to the circuit input and/or an energy flow from the power supply circuit to the load circuit is enabled,
wherein the circuit output of the protection circuit is electrically connected with the circuit input of the power supply circuit,
wherein the first circuit input of the protection circuit is adapted to be electrically connected with a circuit output of an external energy supply providing a supply voltage for the electronics, and wherein the second circuit input of the protection circuit is electrically connected with the second circuit output of the power supply circuit, in such a manner that an input voltage applied to the second circuit input corresponds to the cell voltage provided by the energy storer, wherein both the power supply circuit as well as also the protection circuit have, in each case, at least two operating modes, wherein in a first operating mode of the power supply circuit its energy storer is switched to the first circuit output in such a manner that the cell voltage provided by the energy storer or a voltage proportional thereto is applied to the first circuit output as a first output voltage, wherein in a second operating mode of the power supply circuit, its circuit input is switched to its first circuit output, wherein in a first operating mode of the protection circuit, its first circuit input is switched to its circuit output wherein in a second operating mode of the protection circuit its first circuit input and its circuit output are electrically isolated from one another, and wherein the protection circuit is adapted in the first operating mode to monitor the cell voltage applied to the second circuit input to determine whether its voltage level has exceeded a predetermined maximum value lying above its nominal value and, in given cases, automatically to deactivate its first operating mode or automatically to switch from its first operating mode into its second operating mode; and electrically coupled with the electronics, a measuring transducer, which is adapted to register at least one physical or chemical measured variable and to transduce the registered measured variable into at least one measurement signal representing the measured variable.

21. The measuring system as claimed in claim 20, wherein the electronics is adapted to receive and to evaluate the at least one measurement signal.

22. The measuring system as claimed in claim 21, wherein the load circuit of the electronics includes an evaluator module adapted, based on the at least one measurement signal, to ascertain measured values quantifying the measured variable.

23. The measuring system as claimed in claim 22, wherein the load circuit of the electronics includes, coupled with the evaluator module, a radio module adapted by means of a radio signal to output measured values ascertained by the evaluator module.

* * * * *